United States Patent [19]
Hasegawa

[11] Patent Number: 5,990,533
[45] Date of Patent: Nov. 23, 1999

[54] SEMICONDUCTOR DEVICE INCLUDING A MAGNETORESISTANCE EFFECT ELEMENT FUNCTIONING AS A CURRENT DETECTOR

[75] Inventor: Yuji Hasegawa, Tokyo, Japan

[73] Assignee: NEC Corporation, Tokyo, Japan

[21] Appl. No.: 08/829,170

[22] Filed: Mar. 31, 1997

[51] Int. Cl.[6] .............................. H01L 29/82; H01L 43/00
[52] U.S. Cl. ......................... 257/421; 257/422; 257/427
[58] Field of Search ..................................... 257/421, 422, 257/426, 427, 337, 467, 469, 423, 108

[56] References Cited

U.S. PATENT DOCUMENTS

| 5,023,684 | 6/1991 | Tsunoda ..................................... 257/423 |
| 5,471,084 | 11/1995 | Suzuki et al. ............................. 257/427 |

FOREIGN PATENT DOCUMENTS

| 61-97574 | 5/1986 | Japan . |
| 6-222082 | 8/1994 | Japan . |

Primary Examiner—Steven H. Loke

[57] ABSTRACT

Disclosed is a semiconductor device with a current detector, in which a semiconductor element for current-driving a load and a current-detecting element for detecting a driving current flowing through the semiconductor element are integrated on a common semiconductor pellet, and which has: a magnetoresistance effect element which has a two layer film composed of a magnetic film and a conductive film and means for supplying the two-layer film with a constant current and which has a resistivity depending on a magnetic field generated by the driving current; wherein the magnetoresistance effect element is vertically deposited above the semiconductor element to function as the current-detecting element.

18 Claims, 6 Drawing Sheets

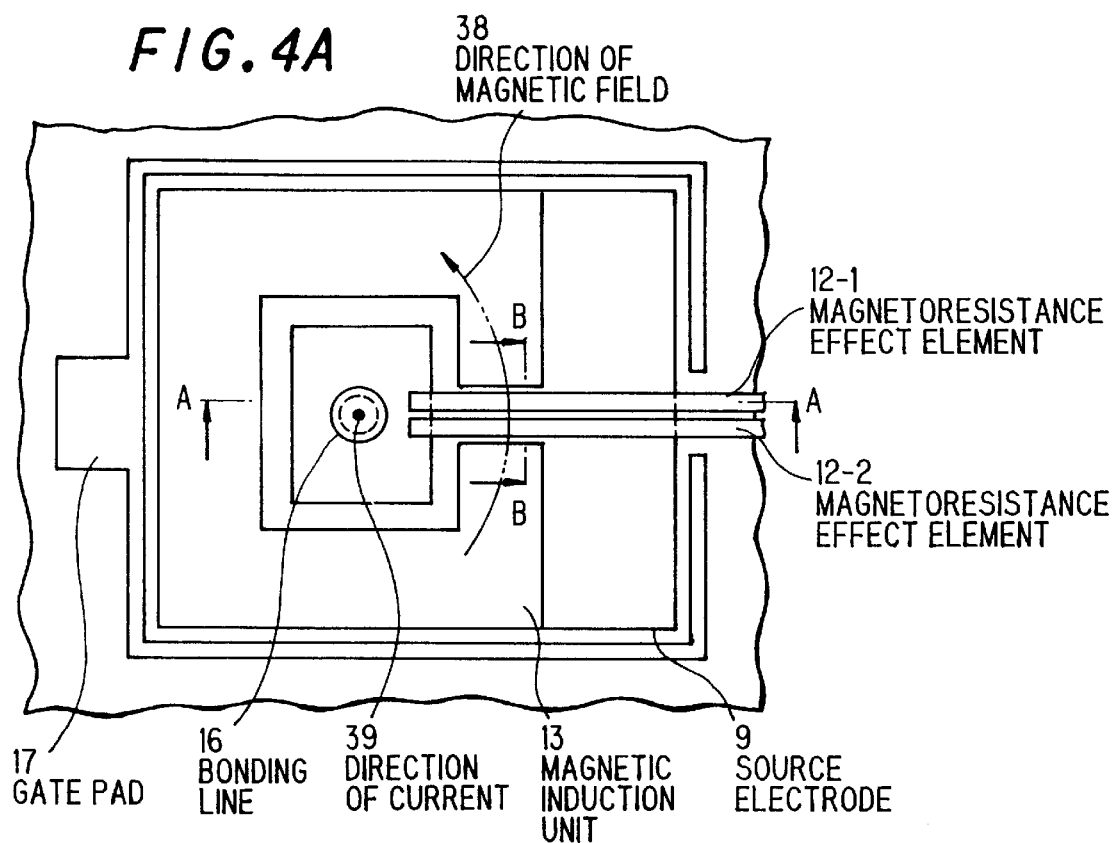
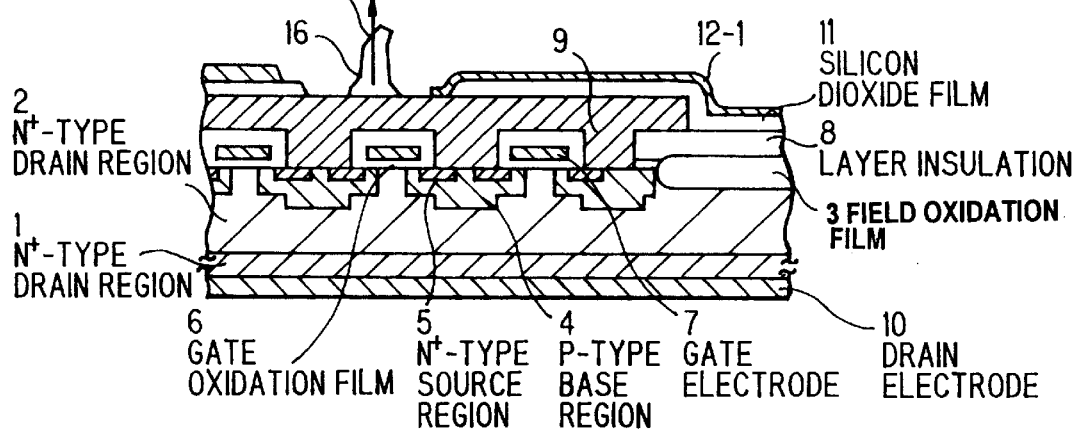
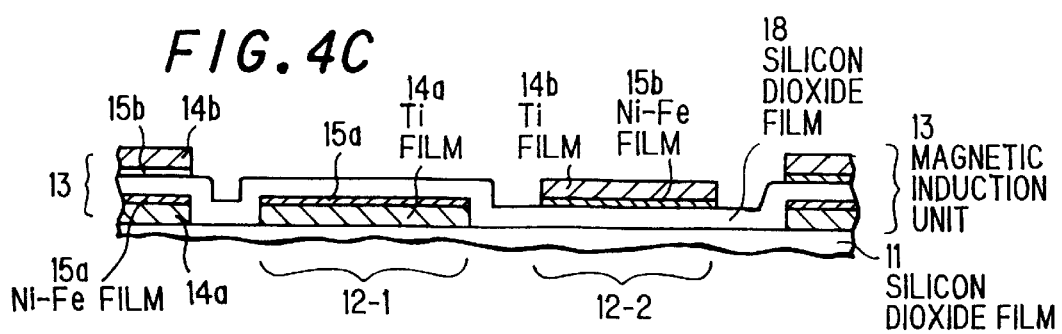

SEMICONDUCTOR DEVICE INCLUDING A MAGNETORESISTANCE EFFECT ELEMENT FUNCTIONING AS A CURRENT DETECTOR

FIELD OF THE INVENTION

This invention relates to a semiconductor device with a current detector, and more particularly to, a semiconductor device in which a semiconductor element for current-driving a load and a current-detecting element are formed.

BACKGROUND OF THE INVENTION

A semiconductor device with which a hole element for detecting a current value flowing into a semiconductor element for current-driving a load is provided is known. For example, Japanese patent application laid-open No. 61-97574 (1986) discloses a semiconductor device with a current detector which has a pellet composition around such hole element, where a current path between an output terminal and a ground terminal is formed in the shape of a letter 'C'. In an area surrounded by the C-shaped current path, an emitter electrode and an collector electrode are formed. On the both sides of a line tying between the emitter electrode and the collector electrode, a pair of hole electrodes are formed.

As described above, in the conventional semiconductor device, the hole element is formed on the pellet surface and the C-shaped current path is formed around the hole element since the hole voltage can be most efficiently obtained when the direction of a constant current flowing from the collector region to the emitter region, the line tying between the pair of hole electrodes and the direction of magnetic field applied to the hole element are orthogonally disposed one another.

However, due to the current path formed around the hole element, the resistivity between the output terminal and the ground terminal is increased. Therefore, even if the resistivity or voltage generated when the semiconductor element is turned on is reduced, it is difficult for the entire semiconductor device to have a low 'on' resistivity or low voltage. At the same time, there occurs an increase in temperature due to the generation of heat. Furthermore, there occurs an increase in temperature due to the generation of heat at the semiconductor element and the surroundings by the driving current and the generation of heat by the constant current fed to the hole element, therefore causing an instability in the hole voltage which indicates a current to be detected.

SUMMARY OF THE INVENTION

Accordingly, it is an object of the invention to provide a semiconductor device with a current detector in which an increase in temperature caused by 'on' resistivity can be suppressed.

It is a further object of the invention to provide a semiconductor device with a current detector whose current-detecting function is provided with a reduced temperature dependency.

According to the invention, a semiconductor device with a current detector, in which a semiconductor element for current-driving a load and a current-detecting element for detecting a driving current flowing through the semiconductor element are integrated on a common semiconductor pellet, comprises:

a magnetoresistance effect element which comprises a two layer film composed of a magnetic film and a conductive film and means for supplying the two-layer film with a constant current and which has a resistivity depending on a magnetic field generated by the driving current;

wherein the magnetoresistance effect element is vertically deposited above the semiconductor element to function as the current-detecting element.

BRIEF DESCRIPTION OF THE DRAWINGS

The invention will be explained in more detail in conjunction with the appended drawings, wherein:

FIG. 4A is a partial plan view showing main part of the semiconductor device in the first embodiment, FIG. 4B is a cross sectional view cut along the line A—A in FIG. 4A, FIG. 4C is an enlarged cross sectional view cut along the line B—B in FIG. 4A.

DESCRIPTION OF THE PREFERRED EMBODIMENTS

Before explaining a semiconductor device with a current detector in the preferred embodiments, the aforementioned conventional semiconductor device with the current detector will be explained in FIGS. 1 to 2B.

Figure 1:
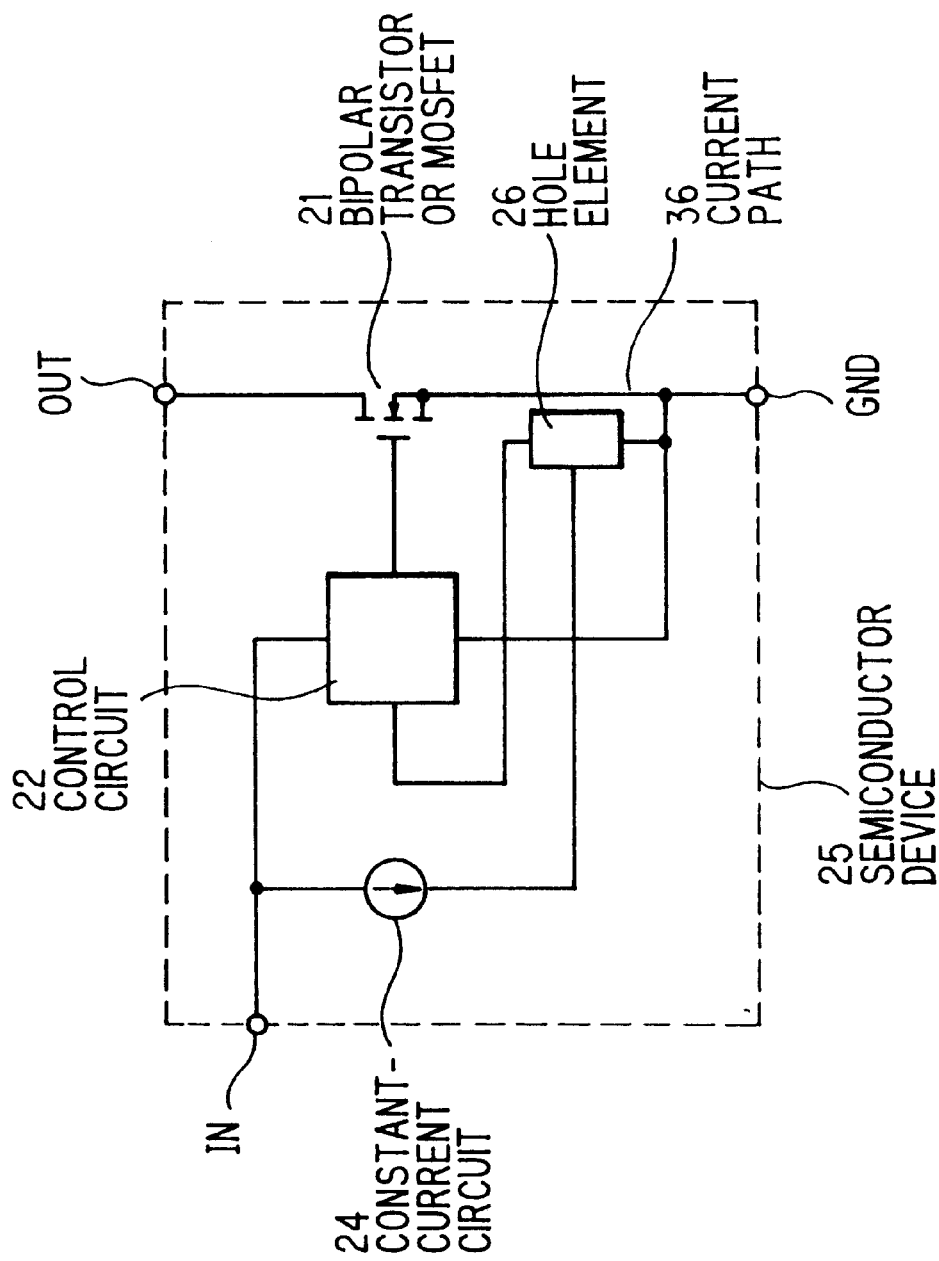
FIG. 1 is a block diagram showing a conventional semiconductor device with a current detector.

FIG. 1 shows a block diagram showing such semiconductor device 25. As shown, the semiconductor element comprising a bipolar transistor or MOSFET 21 which current-drives the load is connected to an output terminal OUT connected with the load and to an ground terminal GND giving a reference potential to the semiconductor element, and a hole element 26 is disposed nearby a current path 36 between the output terminal OUT and the ground terminal GND. To an input terminal IN of the semiconductor device 25, a constant-current circuit 24 and a control circuit 22 are connected. The constant-current circuit 24 feeds the hole element 26 with a constant current. A voltage that is generated at the hole element 26 depending-on a current flowing through the current path 36 is input to the control circuit 22, which controls an input signal of MOSFET 21.

Figure 2A:
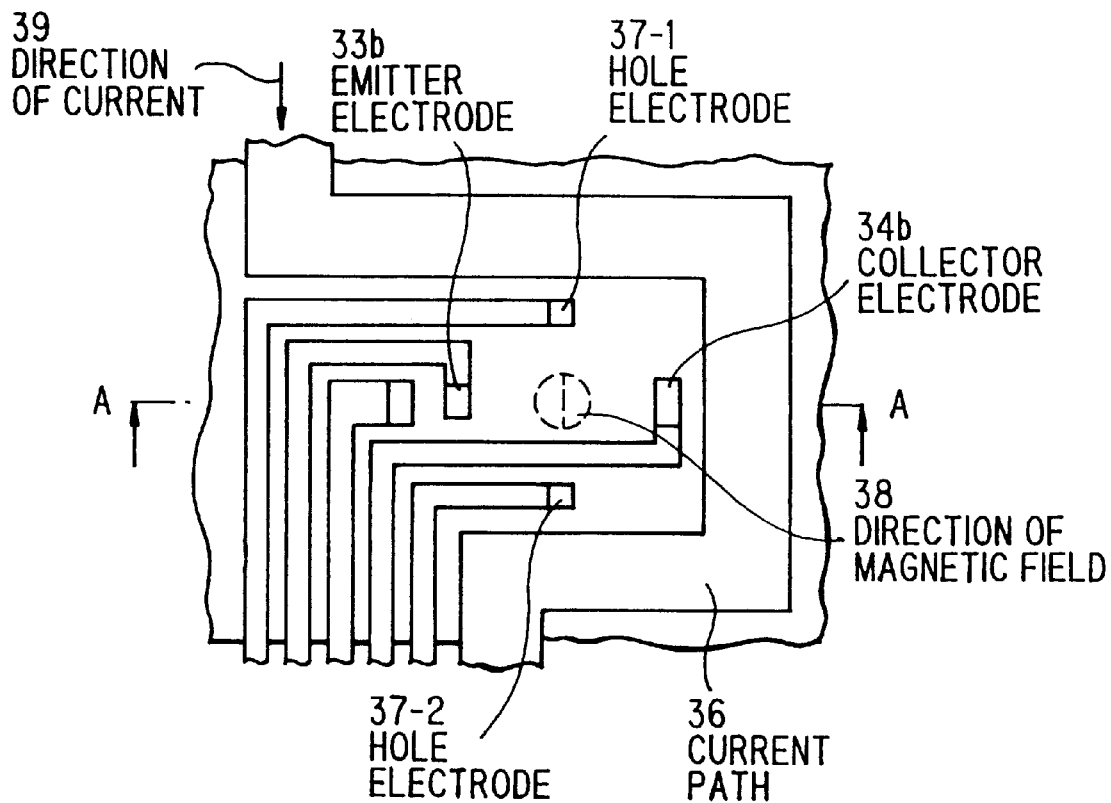
FIG. 2A is a partial plan view showing main part of another conventional semiconductor device with a current detector.
Figure 2B:
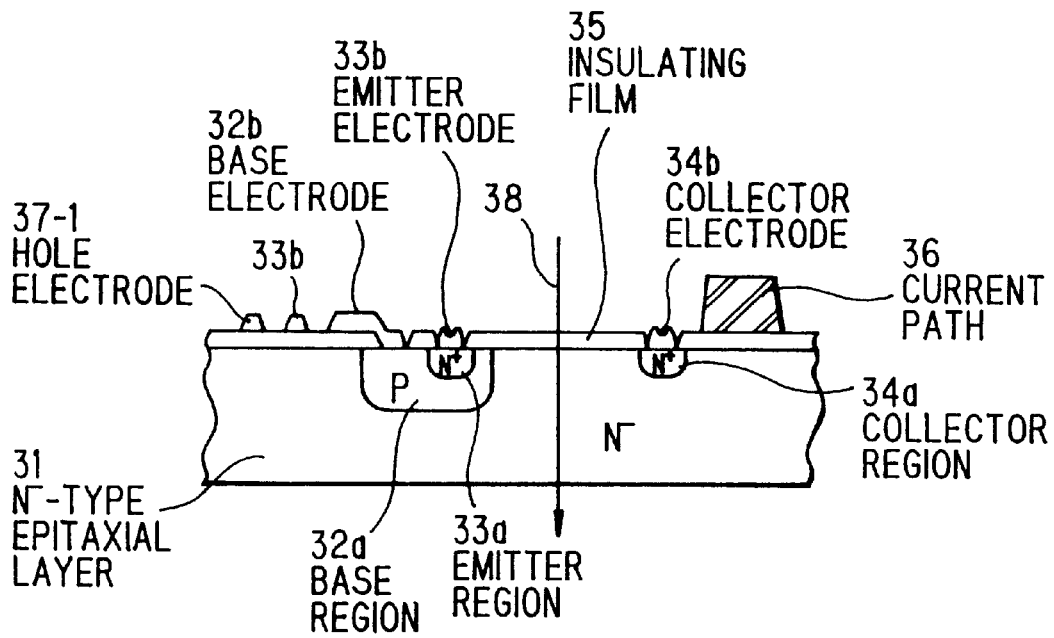
FIG. 2B is a cross sectional view cut along the line A—A in FIG. 2A.

FIGS. 2A and 2B show an example of pellet composition around the hole element 26, which is disclosed in Japanese patent application laid-open No. 61-97574(1986). As shown, the current path 36 between the output terminal OUT and the ground terminal AND is formed in the shape of a letter 'C' by a 10 μm thick Ag layer on an insulating film 35 formed on the pellet surface. In an area surrounded by the C-shaped current path 36, an emitter electrode 33b and an collector electrode 34b are formed. On the both sides of a line tying between the emitter electrode 33b and the collector electrode 34b, hole electrodes 37-1, 37-2, each of which is connected to one of a pair of hole regions formed as N$^+$ diffusion regions, are formed. The collector electrode 34b is connected to the constant-current circuit 24, the emitter electrode 33b is connected to the ground terminal GND and the other ends of the pair of hole electrodes 37-1, 37-2 are connected to the control circuit 22.

In an around 10 μm thick N$^-$-type epitaxial layer 31 which is electrically separated from MOSFET 21 on the same pellet, a base region 32a formed as a P-type diffusion region is formed. In the base region 32a, an a emitter region 33a formed as a N$^+$-type diffusion region is formed. Furthermore, in the N$^-$-type epitaxial layer 31, a collector region 34a formed as a N$^+$-type diffusion region is also formed.

In operation, for example, when several amperes of current is flown into the current path 36 in a direction of current 39, hundreds of thousands($10^5$)/4π(A/m) of magnetic field is generated in a direction of magnetic field 38 inside the C-shaped current path 36. Here, for example, if the size of the area surrounded by the current path 36 is 50 μm, several tens mV of voltage is output between the hole electrodes when a constant current of several mA is flown from the collector region 34a to the emitter region 33a. The hole voltage corresponding to the current value flowing through the current path 36 is input to the control circuit 22, where, depending on the detected current value, the driving current is controlled by controlling the input voltage of MOSFET 21 or by conducting a PWM control.

Figure 3:
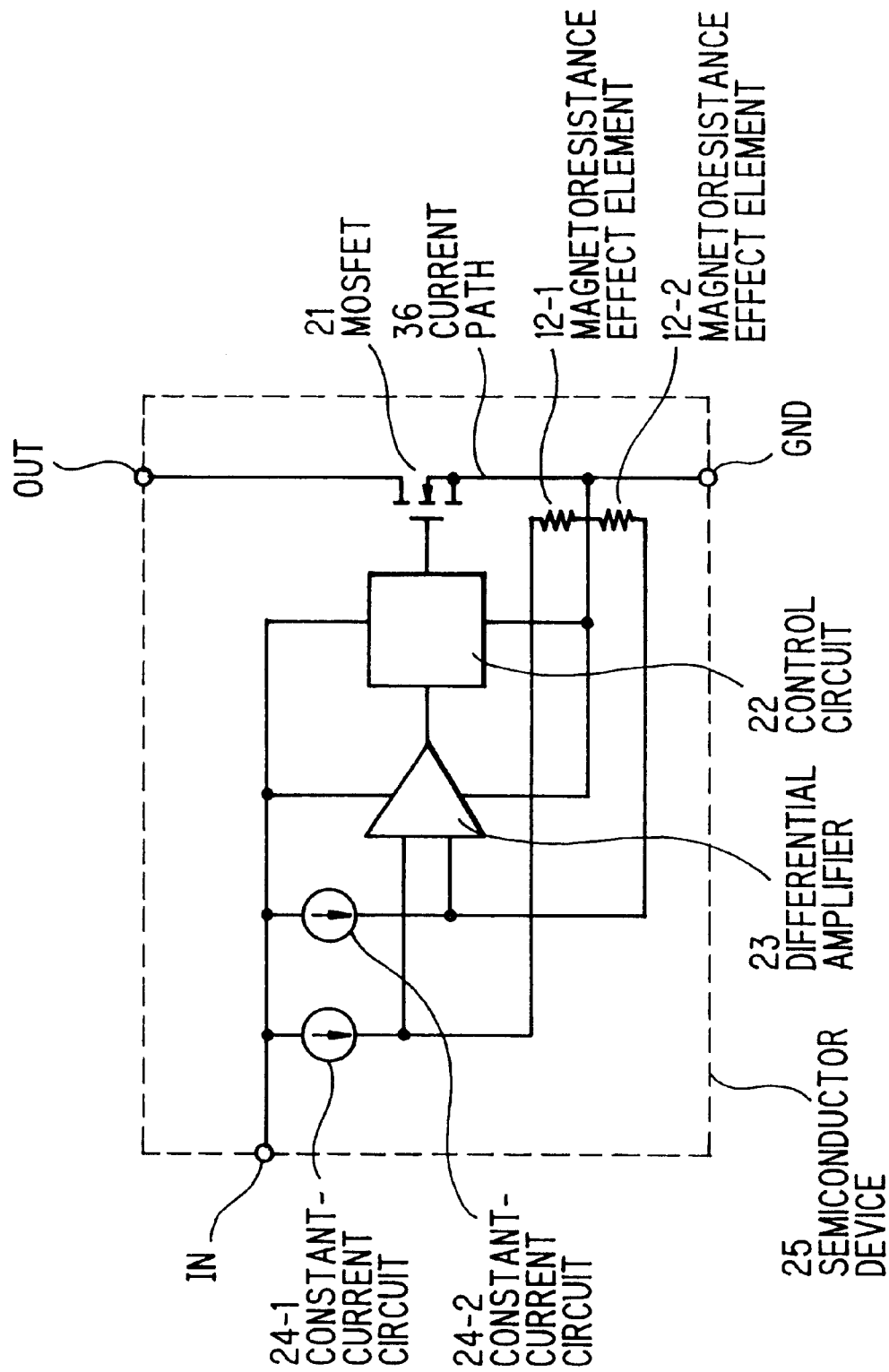
FIG. 3 is a block diagram showing a semiconductor device with a current detector in a first preferred embodiment according to the invention.

Next, a semiconductor device with a current detector in the first preferred embodiment of the invention will be explained in FIG. 3, wherein like parts are indicated by like reference numerals as used in FIG. 1.

In the first embodiment, a semiconductor element such as a bipolar transistor or MOSFET 21 is connected to an output terminal OUT connected with a load and to an ground terminal GND giving a reference potential to the semiconductor element, and a pair of magnetoresistance effect elements 12-1, 12-2 are disposed nearby a current path 36 between the output terminal OUT and the ground terminal GND. To an input terminal IN of the semiconductor device 25, a pair of constant-current circuits 24-1, 24-2 and a control circuit 22 are connected. The constant-current circuits 24-1, 24-2 feed the respective magnetoresistance effect elements 12-1, 12-2 with a constant current. A voltage that is generated at the magnetoresistance effect elements 12-1, 12-2 depending on a current flowing through the current path 36 is input to the control circuit 22, which controls an input signal of the semiconductor element(MOSFET) 21 which current-drives the load.

FIGS. 4A to 4C show a semiconductor pellet that composes a main part of the semiconductor device in the first embodiment, where FIG. 4A is a plan view thereof, FIG. 4B is a cross sectional view cut along the line A—A in FIG. 4A and FIG. 4C is an enlarged cross sectional view cut along the line B—B in FIG. 4A. Throughout the disclosure, said semiconductor element may be a vertical type IGFET which is composed of a source electrode connected onto a front surface of a semiconductor substrate and a drain electrode formed on a back surface of said semiconductor substrate. A known vertical IGFET (DMOS transistor) is formed on a N-type silicon substrate which comprises a N$^+$-type drain region 1 and a N-type drain region 2. Namely, 4 is P-type base region, 5 is N$^+$-source region, 6 is a gate oxidation film, 7 is a gate electrode, 3 is a field oxidation film, 8 is a layer insulation, 9 is a source electrode and 17 is a gate pad connected with the mesh-like gate electrode 7. Besides, FIG. 4B shows a schematic cell structure of the DMOS transistor, where the real size of cell is not shown. Silicon dioxide film 11 which covers the surface of the vertical IGFET (surface of the source electrode 9 of aluminum etc.) is provided with a window, and a bonding line 16 is then bonded to exposed part of the source electrode 9. The other end of the bonding line 16 is connected to the ground terminal GND. A drain electrode 10 is connected to the output terminal OUT through a lead frame (not shown).

The location of the magnetoresistance effect elements 12-1, 12-2 and a magnetic induction unit 13 is shown in FIGS. 4A and 4B, and a detailed structure thereof is shown in FIG. 4C. On the semiconductor pellet, the magnetic induction unit 13 comprising Ni-Fe films is formed in the shape of a letter 'C' on the insulating film 11 around the bonding line 16, and, in the nick (gap) of the C-shaped magnetic induction unit 13, the pair of magnetoresistance effect elements 12-1, 12-2 are formed. One end of the magnetoresistance effect element 12-1 or 12-2 is connected to the source electrode 9 and the other end thereof is connected to the differential amplifier 23.

The magnetoresistance effect element 12-1 is composed of a several μm wide stripe two-layer film which compiles a 0.15 μm thick Ti film 14a as a shunt bias film and a 0.04 μm thick Ni-Fe film (permalloy film) 15a as a magnetoresistance effect film. 18 is a 0.15 μm silicon dioxide film. The magnetoresistance effect element 12-2 is composed of a several μm wide stripe two-layer film which compiles a 0.15 μm thick Ti film 14b as a shunt bias film and a 0.04 μm thick Ni-Fe film 15b as a magnetoresistance effect film. Though the magnetic induction unit 13 has a layered structure of Ti film 14a/Ni-Fe film 15a/silicon dioxide film 18/Ni-Pe film 15b/Ti film 1b, the total thickness of Ni-Fe film may be increased by further forming a silicon dioxide film and a Ni-Fe film on them and patterning these films.

A constant current in the same direction is flown from the constant-current circuits 24-1, 24-2 into the pair of magnetoresistance effect elements 12-1, 12-2, and the current flowing through the shunt bias films 14a, 14b applies a magnetic bias to the adjacent magnetoresistance effect films 15a, 15b.

Figure 5:
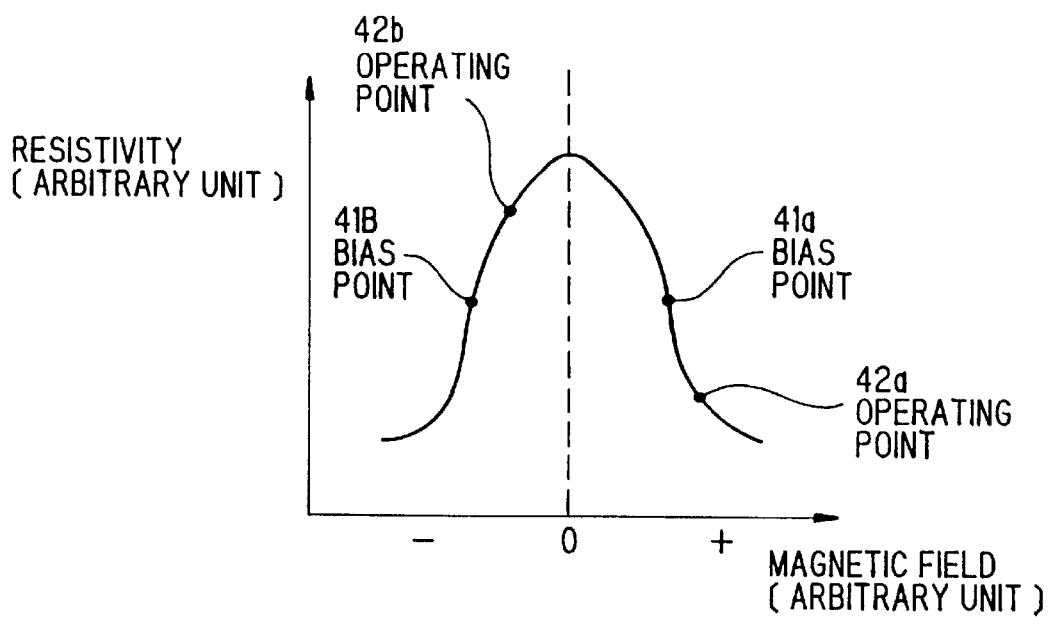
FIG. 5 shows magnetoresistance characteristics of magnetoresistance effect elements of the semiconductor device in the first embodiment.

FIG. 5 shows a magnetoresistance characteristic of the magnetoresistance effect elements 12-1, 12-2. In the pair of magnetoresistance effect elements 12-1, 12-2, the relative position of the magnetoresistance effect film and the shunt bias film is reverse to each other. Therefore, when a current of several tens mA is flown through the magnetoresistance effect elements 12-1, 12-2, there occur bias points 41a, 41b with reverse bias magnetic field states to each other of hundreds of thousands ($10^5$)/4π(A/m). Since the magnetic field generated by the current 39 flowing into MOSFET 21 applies to the pair of magnetoresistance effect elements 12-1, 12-2 in the same direction of magnetic field 38, one of the resistivities of the magnetoresistance effect elements 12-1, 12-2 is decreased and the other is increased as shown by operating points 42a, 42b. By conducting a differential operation of a voltage difference from a resistivity difference of the states 42a, 42b by using the differential amplifier 23, a current value flowing into MOSFET 21 can be obtained. For example, when the current 39 of several amperes is flown into MOSFET 21, a magnetic field generated by the current is hundreds of thousands ($10^5$)/4π(A/m) in the direction of magnetic field 38. Here, when the lengths in the stripe direction of the pair of magnetoresistance effect elements 12-1, 12-2 are around 100 μm, an output voltage of several tens mV is obtained by the differential operation. The voltage obtained depending on the current value flowing through MOSFET 21 is input to the control circuit 22, and the driving current is thereby controlled.

Meanwhile, the control circuit 22, differential amplifier 23 and constant-current circuits 24-1, 24-2 are composed of a standard nMOSFET etc. and are integrated on the same semiconductor pellet.

In the first embodiment, since the current-detecting element is vertically disposed on the semiconductor pellet where the vertical IGFET is formed, the current path to be formed around the hole element as in the conventional semiconductor device with the current detector is not necessary, and its 'on' resistivity can be reduced so much, thereby suppressing an increase in temperature so much. On the other hand, since the pair of magnetoresistance effect elements that have reverse polarity magnetic field dependency to the driving current and the differential amplifier are used, a temperature-dependency in detection function can be suppressed.

Figure 6A:
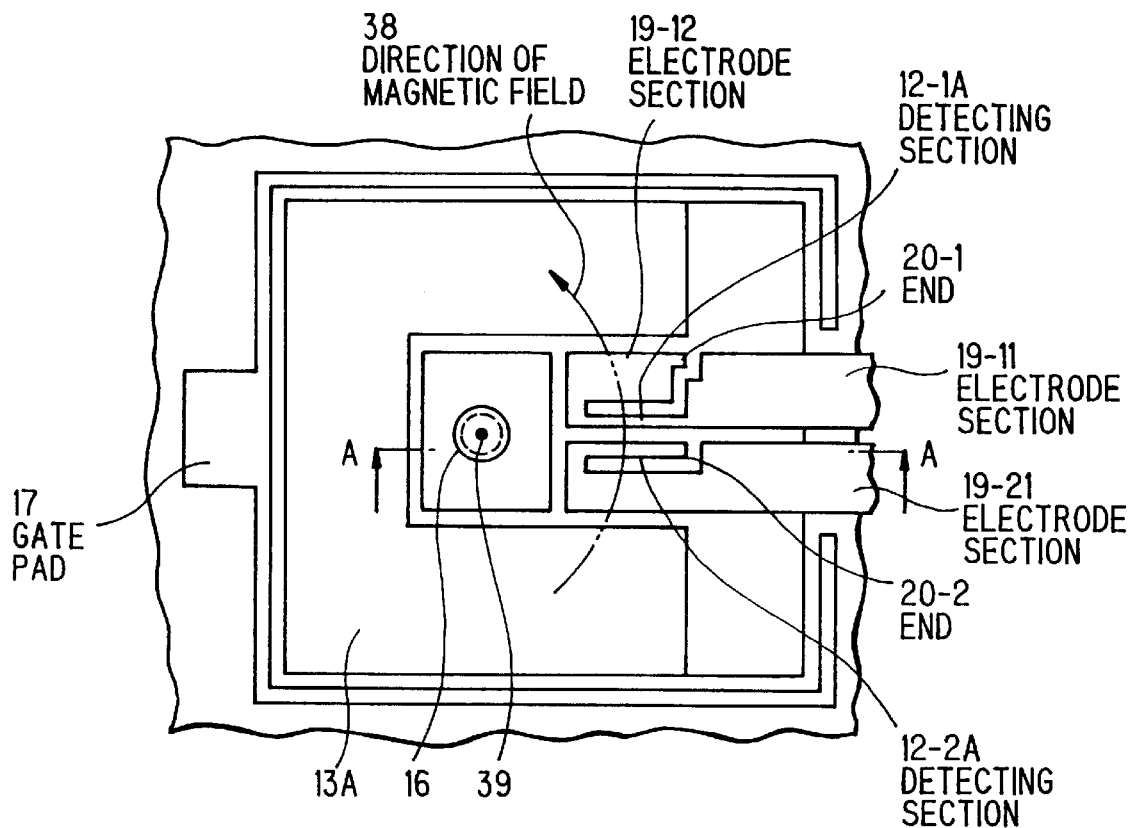
FIG. 6A is a partial plan view showing main part of a semiconductor device with a current detector in a second preferred embodiment according to the invention.
Figure 6B:
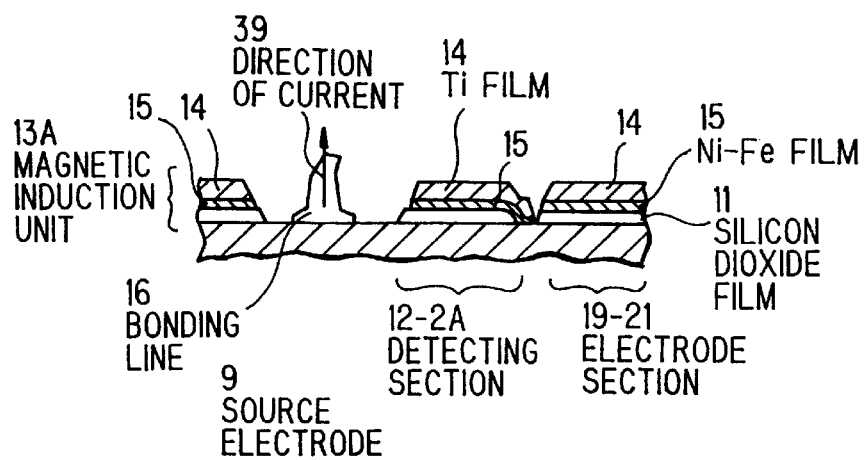
FIG. 6B is a cross sectional view cut along the line A—A in FIG. 6A.

A semiconductor device with a current detector in the second preferred embodiment of the invention will be explained in FIGS. 6A and 6B, where FIG. 6A is a plan view thereof and FIG. 6B is a partial cross sectional view cut along the line A—A in FIG. 6A.

In the second embodiment, both of a pair of magnetoresistance effect elements are composed of a two-layer film in which a magnetoresistance effect film (Ni-Fe film 15) and a shunt film (Ti film 14) are layered in the same order, and their shapes are designed such that the relative direction of current is reverse to each other. The first magnetoresistance effect element has wide electrode sections 19-11, 19-12 which are connected to both ends of a several $\mu$m wide thin stripe detecting section 12-1A, and the end 20-1 of the electrode section 19-12 is connected to the source electrode 9. The second magnetoresistance effect element has a thin stripe detecting section 12-2A which is connected to the end of a wide electrode 19-21 in the direction of reversely parallel to the detecting section 12-1A. An end 20-2 of the detecting section 12-2A is connected to the source electrode 9. The electrode sections 19-11, 19-21 are connected to the constant-current circuits 24-1, 24-2, respectively and to the differential amplifier 23.

Therefore, currents are allowed to pass through the detecting sections 12-1A, 12-2A in the directions of reverse to each other. It is understood that, if the electrode sections 19-11, 19-12 and 19-21 have a width about ten times the widths (several $\mu$m) of the detecting sections, the detecting sections 12-1A, 12-2A can effectively detect the magnetic field. Thus, the pair of magnetoresistance effect elements have effectively the same composition and give operating points of magnetic field which have a reverse bias to each other since the constant currents pass through them in the directions of reverse to each other. Besides, the magnetic induction unit 13A is formed as a two-layer film composed of a Ni-Fe film 15 and a Ti film 14.

The lower structure of the semiconductor chip is the same as that in the first embodiment. The second embodiment has a advantage that the magnetic induction unit 13A and the pair of magnetoresistance effect elements can be formed as the common two layer film, thereby facilitating the production process.

Though, in the above embodiments, the pair of magnetoresistance effect elements and the differential amplifier are used, a single magnetoresistance effect element and a buffer circuit may be alternatively used to detect the driving current. In this case, the temperature dependency in current-detecting function will not be so reduced.

Though, in the above embodiments, the vertical IGFET is used as a semiconductor element for driving the load, a horizontal IGFET or a bipolar transistor may be used. Furthermore, a N-channel IGFET and a NPN transistor as well as a P-channel IGFET and a PNP transistor may be used. The magnetic induction unit can be omitted by parallel depositing a plurality of magnetoresistance effect elements nearby the bonding line as a current path.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device with a current detector, in which a semiconductor element for current-driving a load and a current-detecting element for detecting a driving current flowing through said semiconductor element are integrated on a common semiconductor pellet, comprising:

a magnetoresistance effect element which comprises a two layer film composed of a magnetic film and a conductive film and means for supplying said two-layer film with a constant current and which has a resistivity depending on a magnetic field generated by said driving current;

wherein said magnetoresistance effect element is vertically deposited above said semiconductor element to function as said current-detecting element.

2. A semiconductor device with a current detector, according to claim 1, wherein:

said two-layer film is disposed nearby a pad connected with a bonding line for taking out said driving current from said semiconductor element.

3. A semiconductor device with a current detector, according to claim 2, wherein:

said current detecting element is composed of a pair of said magnetoresistance effect element which have magnetic field polarities reverse to each other caused by the constant current, and said semiconductor device further comprising a differential amplifier for detecting a voltage difference due to a change in resistivities of said pair of said magnetoresistance effect element.

4. A semiconductor device with a current detector, according to claim 3, wherein;

said pair of magnetoresistance effect elements are structured such that the order of layering said magnetic film and said conductive film in each of said pair of magnetoresistance effect elements is reverse to each other and said constant current supplied to each of said pair of magnetoresistance effect elements is flown in the same direction.

5. A semiconductor device with a current detector, according to claim 3, wherein:

said pair of magnetoresistance effect elements are structured such that the order of layering said magnetic film and said conductive film in each of said pair of magnetoresistance effect elements is identical with each other and said constant current supplied to each of said pair of magnetoresistance effect elements is flown in the direction of reverse to each other.

6. A semiconductor device with a current detector, according to claim 2, wherein:

said semiconductor element is a vertical-type IGFET which is composed of a source electrode connected onto a front surface of a semiconductor substrate and a drain electrode formed on a back surface of said semiconductor substrate.

7. A semiconductor device with a current detector, according to claim 1, wherein:

said current detecting element is composed of a pair of said magnetoresistance effect element which have magnetic field polarities reverse to each other caused by the constant current, and said semiconductor device further comprising a differential amplifier for detecting a voltage difference due to a change in resistivities of said pair of said magnetoresistance effect element.

8. A semiconductor device with a current detector, according to claim 7, wherein:

said pair of magnetoresistance effect elements are structured such that the order of layering said magnetic film and said conductive film in each of said pair of magnetoresistance effect elements is reverse to each other and said constant current supplied to each of said pair of magnetoresistance effect elements is flown in the same direction.

9. A semiconductor device with a current detector, according to claim 8, wherein:

said semiconductor element Is a vertical-type IGFET which is composed of a source electrode connected onto a front surface of a semiconductor substrate and a drain electrode formed on a back surface of said semiconductor substrate.

10. A semiconductor device with a current detector, according to claim 7, wherein:

said pair of magnetoresistance effect elements are structured such that the order of layering said magnetic film and said conductive film in each of said pair of magnetoresistance effect elements is identical with each other and said constant current supplied to each of said pair of magnetoresistance effect elements is flown in the direction of reverse to each other.

11. A semiconductor device with a current detector, according to claim 10, wherein:

said semiconductor element is a vertical-type IGFET which is composed of a source electrode connected onto a front surface of a semiconductor substrate and a drain electrode formed on a back surface of said semiconductor substrate.

12. A semiconductor device with a current detector, according to claim 7, wherein:

said semiconductor element is a vertical-type IGFET which is composed of a source electrode connected onto a front surface of a semiconductor substrate and a drain electrode formed on a back surface of said semiconductor substrate.

13. A semiconductor device with a current detector, according to claim 1, wherein:

said semiconductor element is a vertical-type IGFET which is composed of a source electrode connected onto a front surface of a semiconductor substrate and a drain electrode formed on a back surface of said semiconductor substrate.

14. A semiconductor device with a current detector in which a semiconductor element for current-driving a load and a current-detecting element for detecting a driving current flowing through said semiconductor element are integrated on a common semiconductor pellet, comprising:

a magnetoresistance effect element which comprises a two layer film composed of a magnetic film and a conductive film and means for supplying said two-layer film with a constant current and which has a resistivity depending on a magnetic field generated by said driving current;

wherein said magnetoresistance effect element is vertically deposited above said semiconductor element to function as said current-detecting clement;

said two-layer film is disposed nearby a pad connected with a bonding line for taking out said driving current from said semiconductor element;

a magnetic path which is composed of a magnetic induction unit disposed surrounding said bonding line and which has a gap;

wherein said two-layer film is disposed on said gap.

15. A semiconductor device with a current detector, according to claim 14, wherein:

said current detecting element is composed of a pair of said magnetoresistance effect element which have magnetic field polarities reverse to each other caused by the constant current, and said semiconductor device further comprising a differential amplifier for detecting a voltage difference due to a change in resistivities of said pair of said magnetoresistance effect element.

16. A semiconductor device with a current detector, according to claim 15, wherein:

said pair of magnetoresistance effect elements are structured such that the order of layering said magnetic film and said conductive film in each of said pair of magnetoresistance effect elements is reverse to each other and said constant current supplied to each of said pair of magnetoresistance effect elements is flown in the same direction.

17. A semiconductor device with a current detector, according to claim 15, wherein:

said pair of magnetoresistance effect elements are structured such that the order of layering said magnetic film and said conductive film in each of said pair of magnetoresistance effect elements is identical with each other and said constant current supplied to each of said pair of magnetoresistance effect elements is flown in the direction of reverse to each other.

18. A semiconductor device with a current detector, according to claim 14, wherein:

said semiconductor element is a vertical-type IGFET which is composed of a source electrode connected onto a front surface of a semiconductor substrate and a drain electrode formed on a back surface of said semiconductor substrate.

* * * * *